United States Patent
Tsukude

(10) Patent No.: US 6,590,823 B2
(45) Date of Patent: Jul. 8, 2003

(54) REFRESH-CIRCUIT-CONTAINING SEMICONDUCTOR MEMORY DEVICE

(75) Inventor: Masaki Tsukude, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/988,172

(22) Filed: Nov. 19, 2001

(65) Prior Publication Data

US 2002/0176300 A1 Nov. 28, 2002

(30) Foreign Application Priority Data

May 28, 2001 (JP) ........................................ 2001-158368

(51) Int. Cl.$^7$ ................................................ G11C 7/00
(52) U.S. Cl. ........................ 365/222; 365/233; 365/194
(58) Field of Search ................................ 365/222, 233, 365/189.05, 194, 230.08

(56) References Cited

U.S. PATENT DOCUMENTS 5,715,206 A * 2/1998 Lee et al. .................... 365/222
6,327,210 B1 * 12/2001 Kuroda et al. ............... 365/222

FOREIGN PATENT DOCUMENTS

JP            6-119780          4/1994

OTHER PUBLICATIONS

Sawada, et al., "A 30–µA Data–Retention Pseudostatic RAM with Virtually Static RAM Mode," Feb. 1988, pp. 12–19, IEEE Journal of Solid–State Circuits, vol. 23, No. 1.

* cited by examiner

Primary Examiner—David Lam
(74) Attorney, Agent, or Firm—McDermott, Will & Emery

(57) ABSTRACT

A refresh circuit performs directive operation for the execution of refresh operation in response to a cycle signal cyclically output from a timer circuit provided in a command-signal activating circuit. To execute testing, a stop signal generated in response to an external signal is activated, the activated stop signal is input to an AND gate, and the cycle signal is thereby invalidated. This causes the refresh operation to terminate, thereby enabling this semiconductor memory device to refresh characteristic testing to be performed.

6 Claims, 11 Drawing Sheets

REFRESH-CIRCUIT-CONTAINING SEMICONDUCTOR MEMORY DEVICE

BACKGROUND OF THE INVENTION

1. Field of the Invention

The present invention relates to a semiconductor memory device, particularly to a dynamic random access memory capable of performing refresh operation independently of input signals received from external sources (which will hereinbelow be referred to as a "complete-hidden-refresh-function-included DRAM").

2. Description of the Background Art

In a field of portable terminals such as portable telephones, there is widely used an asynchronous general-purpose static random access memory (which will hereinbelow referred to as "SRAM") for which external clocks need not be supplied. In the SRAM, since refresh operation need not be performed, complex control need not be performed. For example, the SRAM need not perform control access that is made to the memory in refresh operation by awaiting completion of a refresh cycle. In view of the above, the SRAMs are suitable for use with the portable terminals.

Recently, since a portable terminal handles images, the function thereof has been significantly improved, and the portable terminal requires large scale memory functions. However, the SRAM has memory which is about 10 times that of a dynamic random access memory (which hereinbelow will be referred to as a "DRAM"). For a large-scale SRAM, the cost for the memory chip is significantly increased, and consequently, the price of the portable terminal is increased. To cope with the problem, a technical scheme has been conceived in which, instead of the SRAM, a DRAM of which memory cost per unit bit is lower is used with the portable terminal.

However, the DRAM requires complex memory control relative to refresh operation. For portable-terminal manufacturers that hitherto have been engaged in design of systems using SRAMs as memories, it is not easy to use DRAMs as substitutive memories of SRAMs.

Under these circumstances, many semiconductor manufacturers have begun the development of a new semiconductor memory device. The new memory device is formed of a DRAM, but it operates as a SRAM in terms of external functions. The new semiconductor memory device is introduced in "Kazuhiro Sawada, IEEE JOURNAL OF SOLID-STATE CIRCUITS, Vol. 23, No.1, February 1998, (pp.12–19)". Hereinbelow, the new semiconductor memory device is referred to as a "complete-hidden-refresh-function-included DRAM".

In the complete-hidden-refresh-function-included DRAM, the same memory cells as those used in the DRAM are used. On the other hand, external interfaces, such as control signals and address signals to be input to the complete-hidden-refresh-function-included DRAM, are the same as those to be input to the SRAM. However, different from refresh operation or self-refresh operation of the conventional DRAM, refresh operation of the complete-hidden-refresh-function-included DRAM is not controlled by signals externally supplied. In specific, the refresh operation is controlled by a refresh command signal /REFE that is cyclically output from a refresh circuit provided in the complete-hidden-refresh-function-included DRAM. The refresh circuit includes a ring oscillator as a timer circuit, and outputs refresh command signal /REFE in response to a cycle signal /Refcyc that is cyclically output from the timer circuit.

FIG. 13 is a timing chart representing a case where refresh operation is executed in a conventional complete-hidden-refresh-function-included DRAM.

In FIG. 13, a timer circuit in the complete-hidden-refresh-function-included DRAM cyclically activates cycle signal /Refcyc, and also activates refresh command signal /REFE in response to the activation of cycle signal /Refcyc. Thereby, the complete-hidden-refresh-function-included DRAM cyclically executes refresh operation either in an operation state where either read operation or write operation for data is readily executable or in a standby state where the data is retained.

As described above, however, the complete-hidden-refresh-function-included DRAM executes refresh operation independently of input signals externally supplied. This causes a problem in that although attempt is made to perform testing for evaluation of refresh characteristics, the testing cannot be performed for observation and evaluation of refresh characteristics.

SUMMARY OF THE INVENTION

An object of the present invention is to provide a semiconductor memory device including a complete hidden refresh function that enables testing to be performed for observation and evaluation of refresh characteristics.

A semiconductor memory device of the present invention allows testing to be performed and includes a memory cell array including a plurality of memory cells arranged in a matrix, input-terminal group through which external signals are input, and a complete hidden refresh circuit capable of performing refreshing operation without being externally commanded for data stored in the plurality of memory cells. A function of the complete hidden refresh circuit is invalidated in response to a signal input through the input terminal group.

Preferably, the complete hidden refresh circuit includes a refresh circuit for outputting a refresh command signal for commanding execution of the refresh operation, a control circuit for executing the refresh operation in response to the refresh command signal, in which the function of the refresh circuit is invalidated in response to a signal output from the input terminal group.

In this case, the refresh operation can be forcedly terminated according to an externally input signal, and refresh characteristic evaluation testing can thereby be performed.

In addition, the refresh circuit preferably includes a timer circuit for outputting a cycle signal at a time interval required to refresh the data stored in the plurality of memory cells, a command-signal activating circuit for activating the refresh command signal in response to the cycle signal, a determination circuit for determining as to whether or not the refresh command signal activated needs to be output.

Furthermore, a function of the timer circuit is preferably invalidated in response to a signal input from the input terminal group.

In this case, the refresh operation can be terminated by invalidating the cycle signal that is output from the timer circuit, and the refresh characteristic evaluation testing can therefore be performed.

Still furthermore, a function of the command-signal activating circuit is preferably invalidated in response to a signal input through the input terminal group.

Because of the above arrangement, the command-signal activating circuit is disabled to activate the refresh command signal, and consequently, the refresh operation terminates. Thereby, the refresh characteristic evaluation testing can be performed.

Still furthermore, a function of the determination circuit is preferably invalidated in response to a signal input through the input terminal group.

In this case, the refresh operation can be terminated by invalidating a determination signal that is output from the determination circuit, and the refresh characteristic evaluation testing can thereby be performed.

According to the present invention described above, in the complete-hidden-refresh-function-included DRAM, an external signal is used to terminate the complete-hidden-refresh-function-included DRAM, thereby enabling refresh characteristic evaluation testing to be implemented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
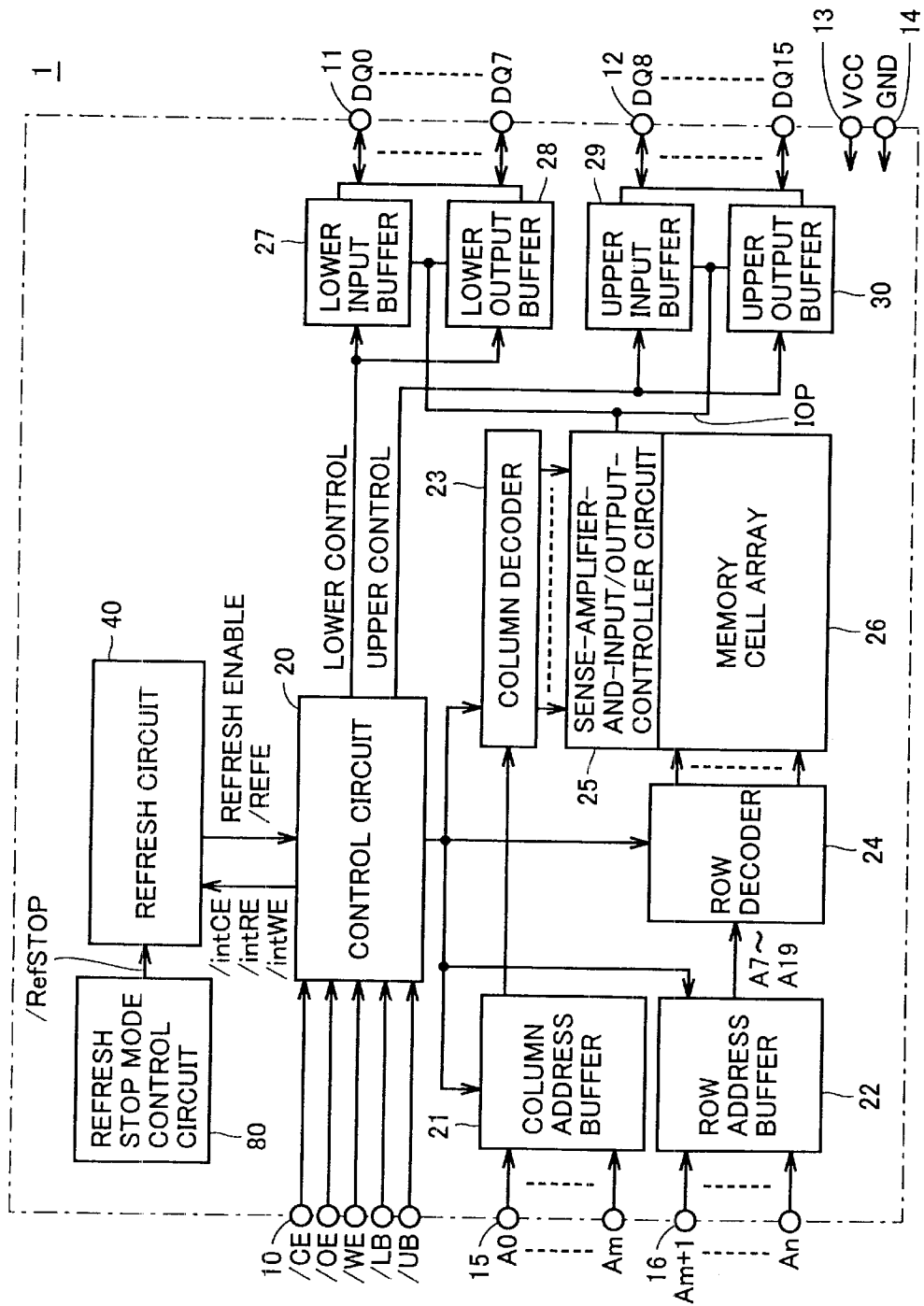
FIG. 1 is an overall configuration view of a complete-hidden-refresh-function-included DRAM according to a first embodiment of the present invention.

Hereinbelow, embodiments will be described in detail referring to the drawings. In the drawings, portions identical to or equivalent to each other are represented by identical numerals or symbols, and description of the portions will not be repeated.

[First Embodiment]

FIG. 1 is an overall configuration view of a complete-hidden-refresh-function-included DRAM according to the first embodiment of the present invention.

Referring to FIG. 1, a complete-hidden-refresh-function-included DRAM 1 includes an input terminal group 10, a terminal group 11, a terminal group 12, an input terminal group 15, an input terminal group 16, a power terminal 13, and a ground terminal 14. Input terminal group 10 receives control signals, namely, a chip enable signal /CE, an output enable signal /OE, a write enable signal /WE, a control signal /LB, and a control signal /UB. Terminal group 11 inputs data signals DQ0 to DQ7 and/or outputs them. Terminal group 12 inputs data signals DQ8 to DQ15 and/or outputs the same. Input terminal group 15 inputs address signals A0 to $A_m$ ("m" represents "1" or a larger natural number). Input terminal group 16 inputs address signals $A_{m+1}$ to $A_n$ ("n" represents "1" or a larger natural number). Power terminal 13 receives a power-supply voltage VCC. Ground terminal 14 is given a ground voltage GND.

Chip enable signal /CE controls complete-hidden-refresh-function-included DRAM to be active. Output enable signal /OE sets complete-hidden-refresh-function-included DRAM to a read mode, and concurrently activates an output buffer. Write enable signal /WE sets complete-hidden-refresh-function-included DRAM 1 to a write mode. Control signal /LB selects the operation of inputting data to input terminal group 11 on a lower bit side and/or outputting data therefrom. Control signal /UB selects the operation of inputting data to input terminal group 12 on an upper bit side and/or outputting data therefrom.

Complete-hidden-refresh-function-included DRAM further includes a control circuit 20, a column address buffer 21, and a row address buffer 22. In response to the control signals that have been input from input terminal group 11, control circuit 20 outputs to individual blocks control clocks corresponding to predetermined operation modes, such as the write mode and the read mode, of the complete-hidden-refresh-function-included DRAM. In response to outputs of control circuit 20, column address buffer 21 receives address signals A0 to Am and transfers them to the inside. In response to outputs of control circuit 20, column address buffer 22 receives address signals $A_{m+i}$ to $A_n$ and transfers them to the inside.

Complete-hidden-refresh-function-included DRAM further includes a column decoder 23, a row decoder 24, a memory cell array 26, and a sense-amplifier-and-input/output-controller circuit 25. In response to outputs of control circuit 20, column decoder 23 receives internal address signals that have been output from column address buffer 21, and specifies column addresses. In response to outputs of control circuit 20, row address buffer 24 receives internal address signals that have been output from column address buffer 22, and specifies row addresses. Memory cell array 26 includes memory cells arranged in a matrix. Sense-amplifier-and-input/output-controller circuit 25 amplifies outputs from memory cell array 26, and performs read operation.

Complete-hidden-refresh-function-included DRAM further includes a lower input buffer 27, a lower output buffer 28, an upper input buffer 29, and an upper output buffer 30. In response to outputs of control circuit 20, the lower input buffer 27 receives data signals DQ0 to DQ7 from terminal group 11, and transfers them to sense-amplifier-and-input/output-controller circuit 25. In response to outputs of control circuit 20, lower output buffer 28 receives signals from sense-amplifier-and-input/output-controller circuit 25, and outputs data signals to terminal group 11. In response to outputs of control circuit 20, upper input buffer 29 receives data signals DQ8 to DQ15 from terminal group 12, and transfers them to sense-amplifier-and-input/output-controller circuit 25. In response to outputs of control circuit 20, upper output buffer 30 receives signals from sense-amplifier-and-input/output-controller circuit 25, and outputs data signals to terminal-group 12.

Complete-hidden-refresh-function-included DRAM further includes a refresh circuit 40. Refresh circuit 40 outputs to control circuit 20 a signal that is cyclically activated, namely, a refresh command signal /REFE, to control circuit 20. Upon receipt of refresh command signal /REFE, control circuit 20 outputs operation command signals to individual blocks for execution of refresh operation.

Complete-hidden-refresh-function-included DRAM further includes a refresh-stop-mode control circuit 80. Refresh-stop-mode control circuit 80 outputs a stop signal /RefSTOP to refresh circuit 40 in response to at least one of external signals that have been input to input terminal groups 10, 15, and 16.

Figure 2:
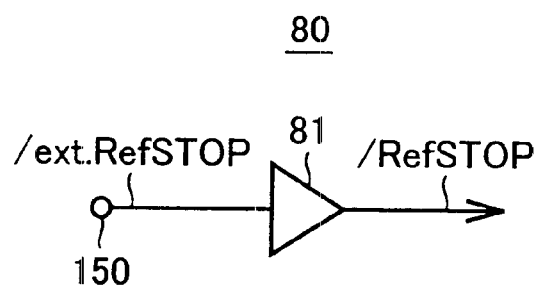
FIG. 2 is an example circuit diagram of a refresh-stop-mode control circuit shown in FIG. 1.

As shown in FIG. 2, refresh-stop-mode control circuit 80 may be formed of, for example, a buffer 81, to output stop signal /RefSTOP in response to an external stop signal ext./RefSTOP that is input from an input terminal 150 which is one of input terminal groups 10, 15, and 16.

Figure 3:
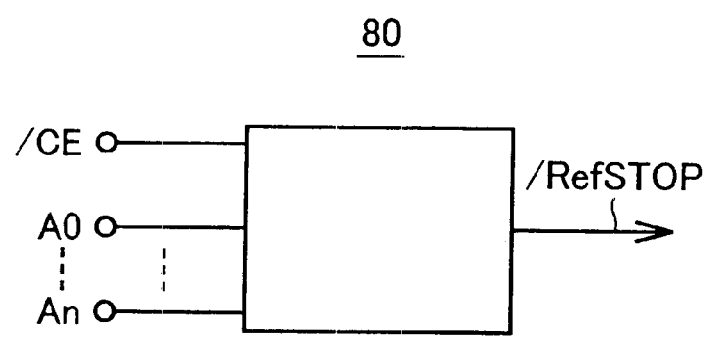
FIG. 3 is another example circuit diagram of refresh-stop-mode control circuit shown in FIG. 1.
Figure 4:
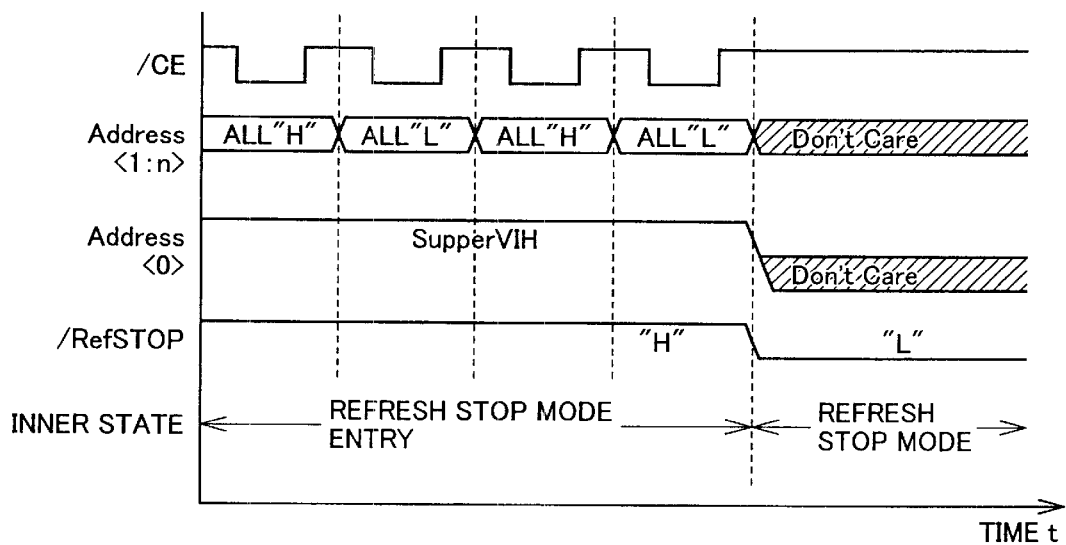
FIG. 4 is a timing chart representing operation of refresh-stop-mode control circuit shown in FIG. 3.

Alternatively, as shown in FIG. 3, refresh-stop-mode control circuit 80 may be configured such that it inputs chip enable signal /CE and address signals A0 to An, and outputs stop signal /RefSTOP in response to a combination thereof. For example, as shown in a timing chart of FIG. 4, during four cycles of chip enable signal /CE, address signal A0 is controlled to be at a voltage level (SuperVIH level) which is higher than a normal level, and "all-H-level" and "all-L-level" are alternately applied in units of the cycle of chip enable signal /CE to thereby activate stop signal /RefSTOP.

Hereinbelow, refresh circuit 40 will be described.

Figure 5:
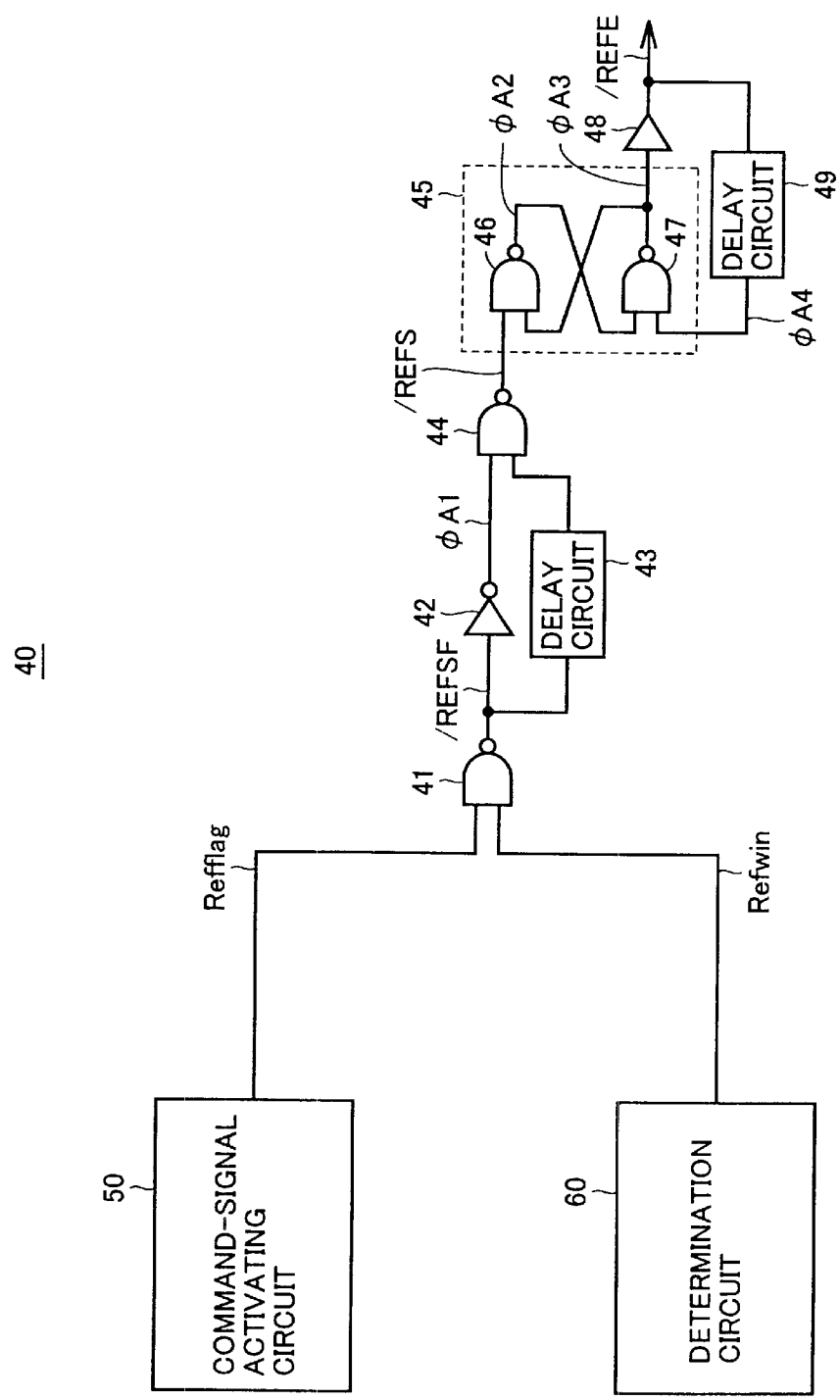
FIG. 5 is a circuit diagram of a refresh circuit shown in FIG. 1.

FIG. 5 is a circuit diagram of refresh circuit 40 shown in FIG. 1.

Referring to FIG. 5, refresh circuit 40 includes a command-signal activating circuit 50, a determination circuit 60, NAND gates 41 and 44, an inverter 42, a buffer 48, delay circuits 43 and 49, and a flip-flop 45.

Command-signal activating circuit 50 outputs a refresh flag signal Refflag that activates refresh command signal /REFE. Determination circuit 60 outputs a determination signal Refwin that determines as to whether or not refresh command signal /REFE activated by refresh flag signal Refflag needs to be output.

NAND gate 41 receives refresh flag signal Refflag and determination signal Refwin and performs operations to generate a logical product of these signals. As a result, it outputs a signal obtained through inversion of the operation result as a signal /REFSF.

Inverter 42 receives signal /REFSF, which has been output from NAND gate 41, and reverses it. A delay circuit 43 receives signal /REFSF, and delays it by a specific period of time.

NAND gate 44 receives an output signal of inverter 42 and an output signal of delay circuit 43, and performs operations to generate a logical product of these signals. As a result, it outputs a signal obtained through inversion of the operation result as a signal /REFS.

Flip-flop 45 is formed to include NAND gates 46 and 47. NAND gate 46 receives signal /REFS and an output signal ϕA3, which has been output from NAND gate 47, and performs operations to generate a logical product of these signals. As a result, it outputs a signal ϕA2 obtained through inversion of the operation result. NAND gate 47 receives an output signal ϕA2, which has been output from NAND gate 46, and a signal ϕA4 output from delay circuit 49, and performs operations to generate a logical product of these signals. As a result, it outputs a signal obtained through inversion of the operation result as a refresh command signal /REFE.

Delay circuit 49 receives refresh command signal /REFE, which has been output from flip-flop 45, and outputs signal ϕA4 delayed by a specific period of time.

Buffer 48 receives output signal ϕA3 and outputs refresh command signal /REFE.

Figure 6:
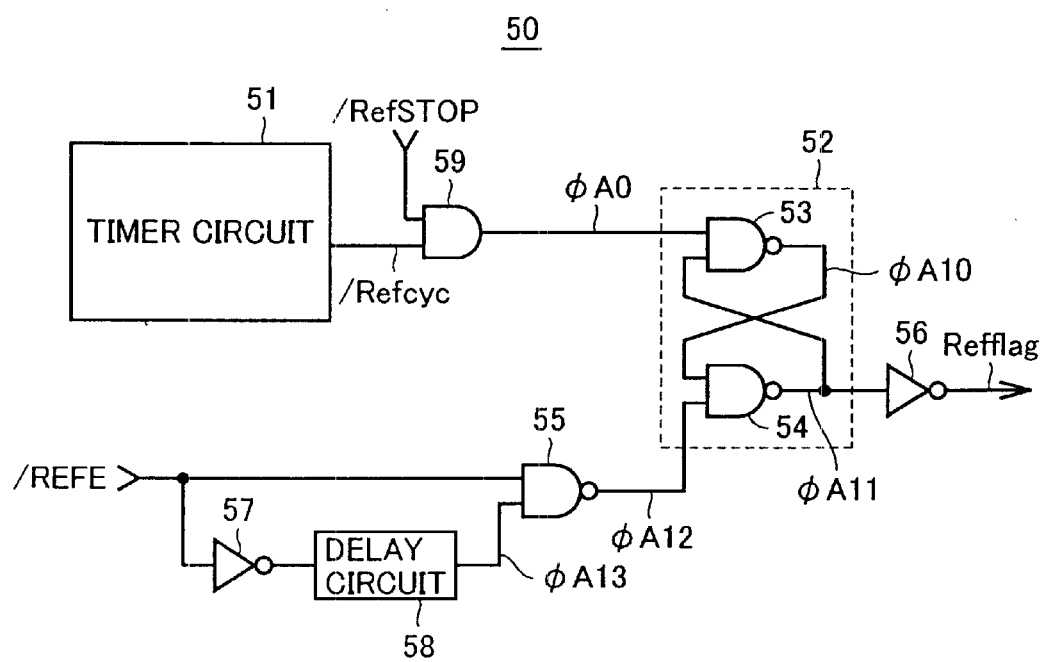
FIG. 6 is a circuit diagram of a command-signal activating circuit shown in FIG. 5.

FIG. 6 is a circuit diagram of command-signal activating circuit 50 shown in FIG. 5.

Referring to FIG. 6, command-signal activating circuit 50 includes a timer circuit 51 that is formed of a ring oscillator and that outputs a cycle signal /Refcyc cyclically activated, a flip-flop 52, inverters 56 and 57, a delay circuit 58, and an AND gate 59.

AND gate 59 receives cycle signal /Refcyc and stop signal /RefSTOP output from refresh-stop-mode control circuit 80, and performs operations to generate a logical product of these signals, and outputs the operation result as a signal +A0.

Flip-flop 52 is formed of NAND gates 53 and 54. NAND gate 53 receives signal ϕA0 and an output signal ϕA11 of NAND gate 54, performs operations to generate a logical product of these signals, and outputs a signal ϕA10 through inversion of the operation result. NAND gate 54 receives output signal ϕA10, which has been output from NAND gate 53. It also receives an output signal ϕA12, which has been output from a NAND gate 55. Then, it performs operations to generate a logical product of output signal ϕA10 and output signal ϕA12, and outputs output signal ϕA11 obtained through inversion of the operation result.

Inverter 56 receives output signal ϕA11, which has been output from flip-flop 52, inverts it, and outputs the inverted signal as refresh flag signal Refflag.

Inverter 57 receives refresh command signal /REFE and inverts it. Delay circuit 58 receives refresh command signal /REFE, which has been inverted by inverter 57, and outputs a signal ϕA13 obtained such that the inverted refresh command signal /REFE is delayed by a specific period of time.

NAND gate 55 receives refresh command signal /REFE and signal ϕA13, which has been output from delay circuit 58, performs operations to obtain a logical product of these signals, and outputs output signal ϕA12, which has been obtained through inversion of the operation result.

Figure 7:
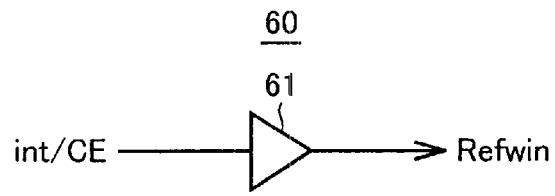
FIG. 7 is a circuit diagram of a determination circuit shown in FIG. 5.

FIG. 7 is a circuit diagram of determination circuit 60 shown in FIG. 5.

Referring to FIG. 7, determination circuit 60 is formed of a buffer circuit 61. Buffer circuit 61 receives an internal chip enable signal int/CE, and outputs determination signal Refwin. Control circuit 20, after receiving chip enable signal /CE from input terminal group 10, generates internal chip enable signal int/CE.

Hereinbelow, operation of refresh circuit 40 having the above-described circuit configuration will be described.

Figure 8:
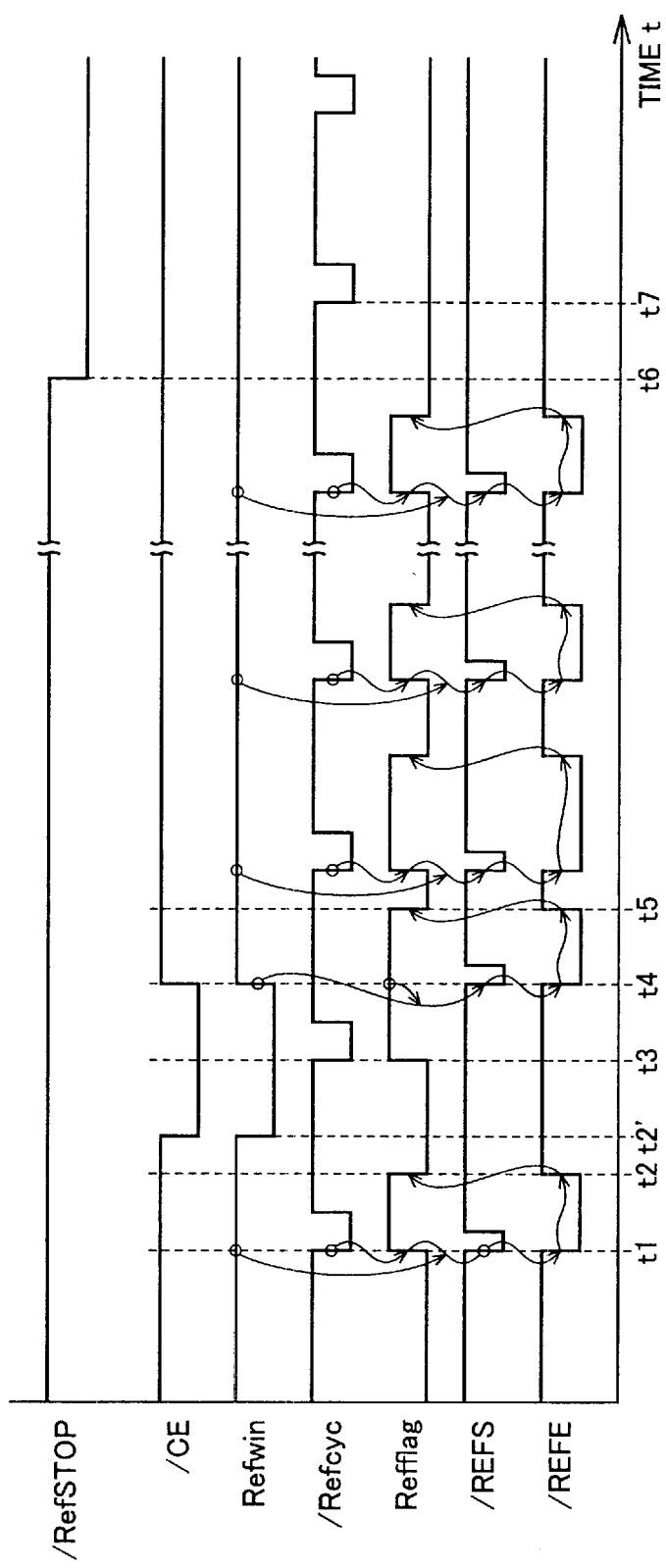
FIG. 8 is a timing chart representing operation of refresh circuit.

FIG. 8 is a timing chart representing operation of refresh circuit 40.

Referring to FIG. 8, when chip enable signal /CE input from input terminal group 10 is inactive, determination circuit 60 determines that refresh operation is executable. That is, determination circuit 60 determines that refresh circuit 40 has been enabled to output refresh command signal /REFE. Consequently, determination signal Refwin that is output from determination circuit 60 becomes active.

A cycle signal /Refcyc that is output from timer circuit 51 is activated at a time t1. At this time, since stop signal /RefSTOP that is output from refresh-stop-mode control circuit 80 is inactive, refresh flag signal Refflag that is output from command-signal activating circuit 50 is activated.

Consequently, NAND gate 41 in refresh circuit 40 receives determination signal Refwin and activated refresh flag signal Refflag, and activates signal /REFSF. NAND gate 44 receives activated signal /REFSF, and outputs signal /REFS activated within the specific period of time set by delay circuit 43.

Flip-flop 45 receives activated signal /REFS, and outputs output signal φA3 activated within the specific period of time set by delay circuit 49. Buffer 48 receives output signal φA3, and outputs refresh command signal /REFE activated within a specific period of time from time t1.

As a result of the above-described operations, when refresh flag signal Refflag output from command-signal activating circuit 50 is activated at time t1, determination circuit 60 determines that refresh operation is executable. That is, at time t1, the determination circuit 60 determines that determination signal Refwin is active. Thereby, when complete-hidden-refresh-function-included DRAM 1 is in a standby state, refresh operation is executable.

Refresh command signal /REFE that is output from refresh circuit 40 is deactivated at a time t2, which is a time point after passage of a specific period of time set by delay circuit 49. At this time, since the level of output signal φA12 that is output from NAND gate 55 in command-signal activating circuit 50 is shifted to an L level, refresh flag signal Refflag that is output from the command-signal activating circuit 50 is deactivated accordingly.

Subsequently, at a time t2', chip enable signal /CE becomes active. In this case, determination circuit 60 determines that refresh operation is not executable, and therefore deactivates determination signal Refwin that is output therefrom.

At a time t3, when cycle signal /Refcyc, which is cyclically activated, is activated, refresh flag signal Refflag that is output from command-signal activating circuit 50 is also activated.

However, since determination signal Refwin that is output from determination circuit 60 remains inactive, signal /REFS that is output from NAND gate 44 also remains inactive. Consequently, refresh command signal /REFE that is output from refresh circuit 40 remains inactive.

Since refresh command signal /REFE remains inactive, output signal +A12 that is output from NAND gate 55 in command-signal activating circuit 50 is at an H level. Accordingly, output signal φA11 that is output from flip-flop 52 remains at the L level. Consequently, refresh flag signal Refflag that is output from command-signal activating circuit 50 becomes active at time t3 and thereafter.

As described above, within a period for which chip enable signal /CE is active, determination circuit 60 determines that refresh operation is not to be executed. When refresh flag signal Refflag that is be output from command-signal activating circuit 50 to activate refresh command signal /REFE is activated within the period for which determination circuit 60 determines that refresh operation is not to be executed, the refresh flag signal Refflag remains active.

Subsequently, chip enable signal /CE is deactivated at a time t4, and complete-hidden-refresh-function-included DRAM thereby enters a standby state. In this case, determination circuit 60 determines that refresh operation is executable, and consequently, determination signal Refwin that is output from determination circuit 60 is activated.

In the above stage, since refresh flag signal Refflag is activated at time t3 and thereafter, signal /REFS that is output from NAND gate 44 in refresh circuit 40 is activated at time t4, and is held active within the specific period of time set by delay circuit 43. Consequently, refresh command signal /REFE that is output from refresh circuit 40 is held active within the specific period of time set by delay circuit 49.

At a time t5, which is a time point after passage of the specific period of time set by delay circuit 49 from time t4, refresh command signal /REFE is deactivated. In addition, in response to the deactivation of refresh command signal /REFE, refresh flag signal Refflag is also deactivated.

Also at and after time t5, when refresh flag signal Refflag is activated within a period in which determination circuit 60 determines that refresh operation is executable, refresh circuit 40 activates refresh command signal /REFE in response to refresh flag signal Refflag.

As a result of the above-described operations, in complete-hidden-refresh-function-included DRAM of the first embodiment, refresh operation is executed also in the standby state.

Hereinbelow, a description will be made regarding a case where refresh characteristic testing is executed in complete-hidden-refresh-function-included DRAM of the first embodiment.

At a time t6 in FIG. 8, stop signal /RefSTOP that is output from refresh-stop-mode control circuit 80 becomes active. Subsequently, at a time t7, when cycle signal /Refcyc that is output from timer circuit 51 is activated, stop signal /RefSTOP is active. Consequently, the level of signal φA0 that is output from AND gate 59 in command-signal activating circuit 50 becomes an L level. Consequently, refresh flag signal Refflag that is output from command-signal activating circuit 50 is not activated.

According to the above operations, when stop signal /RefSTOP is activated at time t6, refresh command signal /REFE that is output from refresh circuit 40 becomes inactive at time t6 and thereafter.

Because of the above, when stop signal /RefSTOP is activated in response to an externally input signal, refresh cycle signal /Refcyc is invalidated. Refresh command signal /REFE is not therefore activated, and consequently, the refresh operation terminates. Thereby, the refresh operation is controlled to also terminate in complete-hidden-refresh-function-included DRAM. This enables refresh-characteristic evaluation testing to be implemented.

[Second Embodiment]

In the first embodiment, the refresh operation is terminated in the manner in which the externally input signal is used to thereby invalidate cycle signal /Refcyc. Refresh operation can similarly be terminated in another manner. In this manner, refresh flag signal Refflag that is output from command-signal activating circuit 50 is invalidated to terminate the refresh operation.

Figure 9:
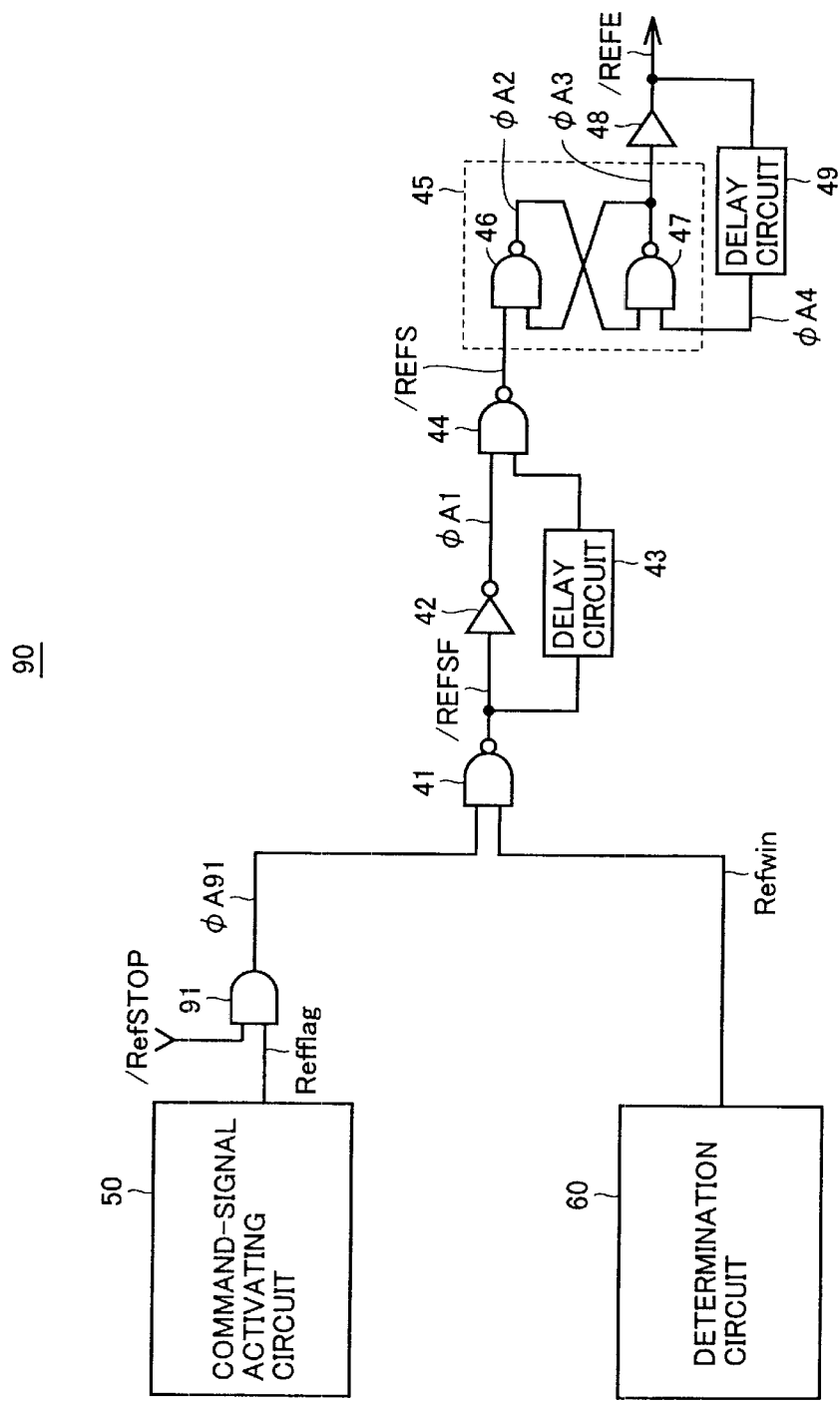
FIG. 9 is a circuit diagram of a refresh circuit according to a second embodiment of the present invention.

FIG. 9 is a circuit diagram of a refresh circuit 90 according to the second embodiment of the present invention.

Compared to refresh circuit 40 shown in FIG. 5, in a refresh circuit 90 referring to FIG. 9, an AND gate 91 is connected between command-signal activating circuit 50 and NAND gate 41.

AND gate 91 receives stop signal /RefSTOP and refresh flag signal Refflag output from command-signal activating circuit 50, performs operations to generate a logical product of these signals, and outputs the operation result as a signal φA91.

Other units in the circuit configuration are the same as those shown in FIG. 5. They are not therefore described to avoid repetition.

Hereinbelow, a description will be given regarding operation of refresh circuit 90 that has the above-described circuit configuration.

Figure 10:
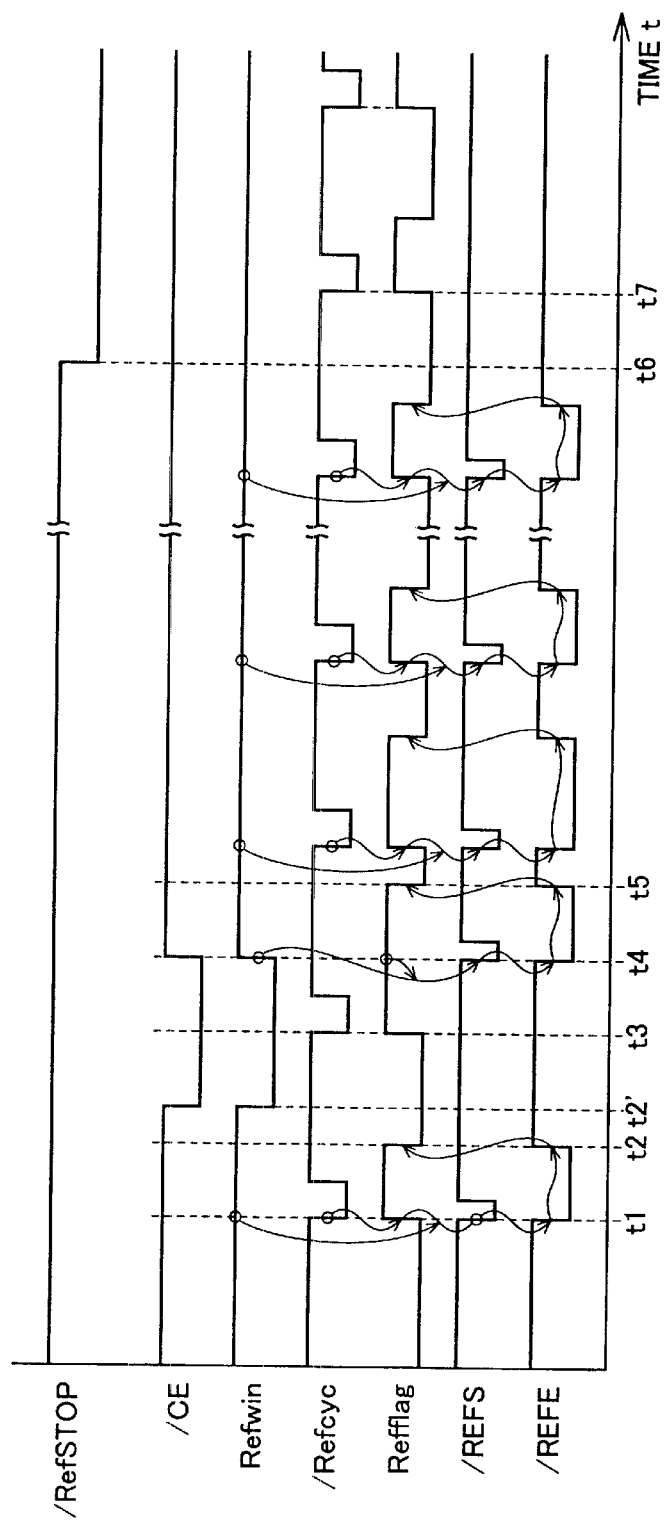
FIG. 10 is a timing chart representing operation of refresh circuit.

FIG. 10 is a timing chart representing operation of refresh circuit 90.

Referring to FIG. 10, operations within the period from times t1 to t5 are the same as those shown in FIG. 8. They are not therefore described to avoid repetition.

At time t6, stop signal /RefSTOP that has been input from the outside of refresh circuit 90 becomes active. The method for activating stop signal /RefSTOP is the same as that in the first embodiment.

When cycle signal /Refcyc that is output from timer circuit 51 is activated at a time t7, a refresh flag signal Refflag also becomes active in response to the activation of cycle signal /Refcyc. However, since signal φA91 that is output from AND gate 91 while stop signal /RefSTOP is active becomes at an L level, signal /REFSF that is output from NAND gate 41 remains inactive. Consequently, signal /REFS that is output from NAND gate 44 is not activated, and refresh command signal /REFE remains inactive.

In specific, although refresh flag signal Refflag is activated at time t6 and thereafter in response to the activation of stop signal /RefSTOP at time t6, AND gate 91 invalidates refresh flag signal Refflag, and consequently, refresh command signal /REFE remains inactive. Thereby, at time t6 and thereafter, refresh operation is terminated in complete-hidden-refresh-function-included DRAM.

As described above, the refresh operation can be terminated also in the way in which a signal is externally input to thereby invalidate refresh flag signal Refflag that is output from command-signal activating circuit 50.

[Third Embodiment]

In addition to the ways described above, in refresh circuit 40 in complete-hidden-refresh-function-included DRAM, the refresh operation can be terminated also by invalidating determination signal Refwin that is output from determination circuit 60.

Figure 11:
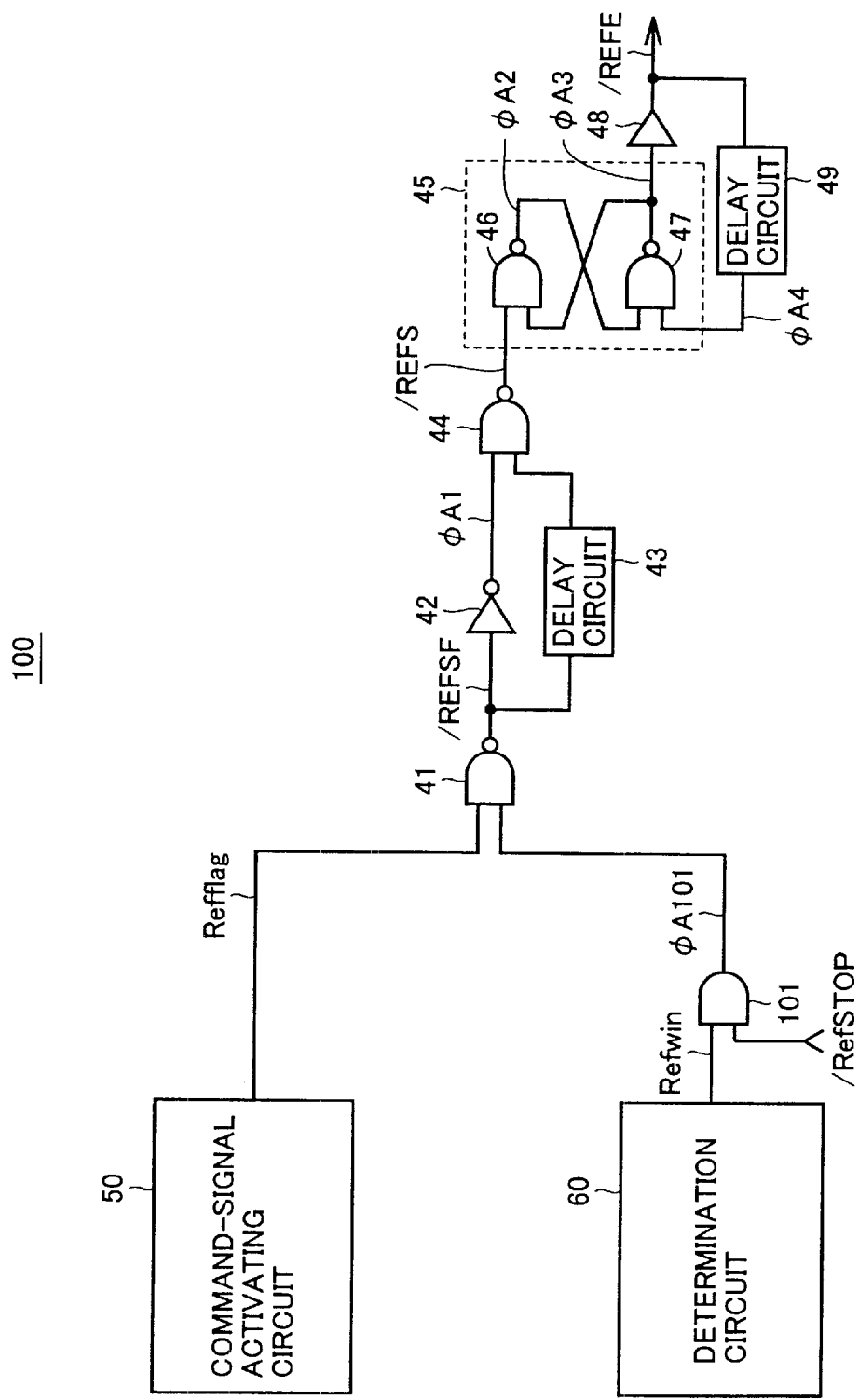
FIG. 11 is a circuit diagram of a refresh circuit according to a third embodiment of the present invention.

FIG. 11 is a circuit diagram of a refresh circuit 100 according to the third embodiment of the present invention.

Compared to refresh circuit 40 shown in FIG. 5, in refresh circuit 100 referring to FIG. 11, an AND gate 101 is connected between determination circuit 60 and NAND gate 41.

AND gate 101 receives stop signal /RefSTOP, which has been output from refresh-stop-mode control circuit 80. Also, it receives determination signal Refwin, which has been output from command-signal activating circuit 50, performs operations to generate a logical product of stop signal /RefSTOP and determination signal Refwin, and outputs the operation result as a signal φA101. Other units in the circuit configuration are the same as those shown in FIG. 5, and descriptions thereof are not therefore given to avoid repetition.

Hereinbelow, operation of refresh circuit 100 will be described.

Figure 12:
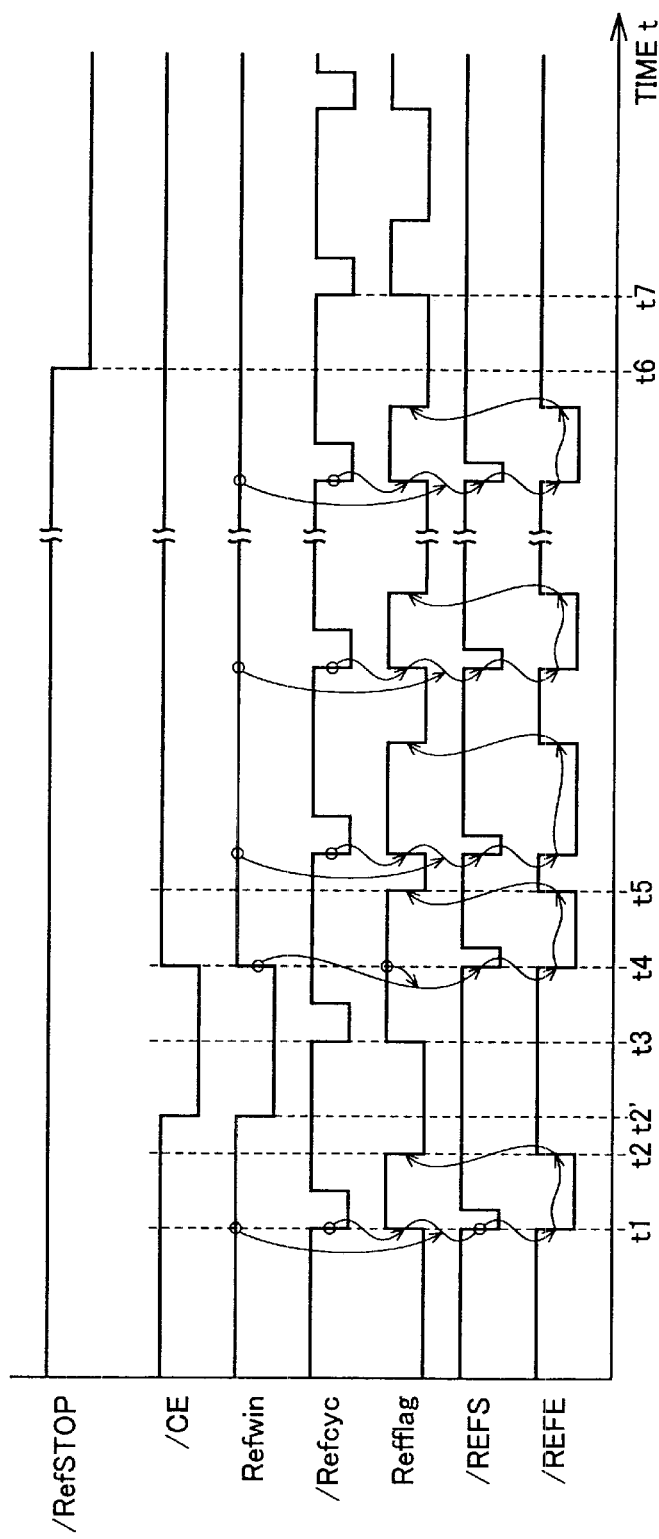
FIG. 12 is a timing chart representing operation of refresh circuit.
Figure 13:
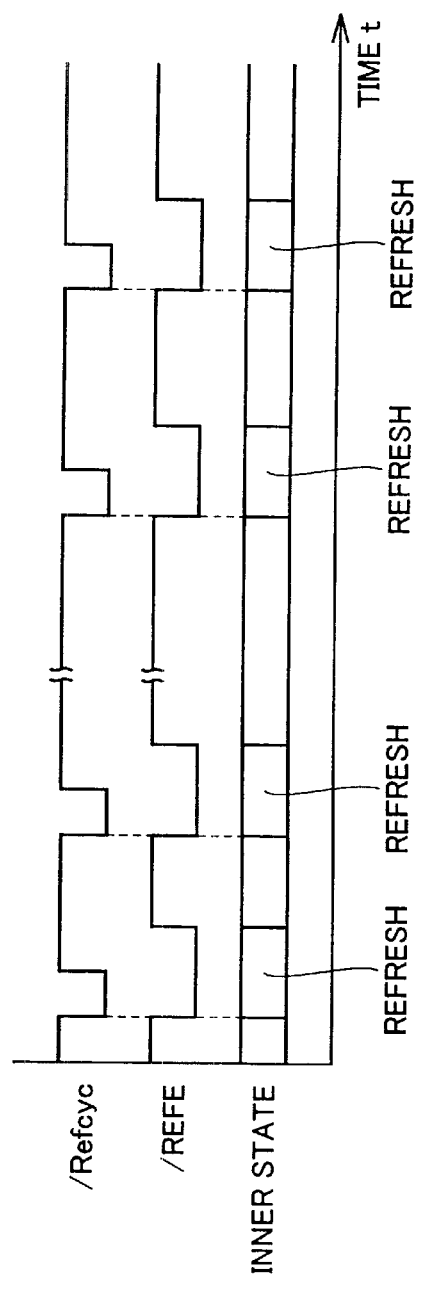
FIG. 13 is a timing chart in a case where refresh operation is executed in a conventional complete-hidden-refresh-function-included DRAM.

FIG. 12 is a timing chart representing operation of refresh circuit 100.

Referring to FIG. 12, operations within the period from times t1 to t5 are substantially the same as those shown in FIG. 8. They are not therefore described to avoid repetition.

When stop signal /RefSTOP that has been input from the outside of refresh circuit 100 becomes active at time 6, and cycle signal /Refcyc that is output from timer circuit 51 is activated at time t7, a refresh flag signal Refflag also becomes active in response to the activation of cycle signal /Refcyc. On the other hand, since chip enable signal /CE is inactive, determination signal Refwin is activate. However, since stop signal /RefSTOP is active, the level of signal φA 101 that is output from refresh circuit 100 becomes an L level. In this case, since signal /REFSF that is output from NAND gate 41 remains inactive, signal /REFS that is output from NAND gate 44 is not activated. Consequently, refresh command signal /REFE remains inactive.

In specific, in response to the activation of stop signal /RefSTOP at time t6, determination signal Refwin is invalidated, and consequently, refresh operation is terminated.

As described above, the refresh operation can be terminated also in the way in which a signal is externally input to thereby invalidate determination signal Refwin. This enables testing to be performed by terminating the refresh operation.

As above, in the first to third embodiments, description has been made in the respective configurations where stop signal /RefSTOP, that has been activated in response to the external signals is used to invalidate cycle signal /Refcyc, refresh flag signal Refflag, and determination signal Refwin. However, stop signal /RefSTOP may be used either to invalidate two of the aforementioned three signals, namely, cycle signal /Refcyc, refresh flag signal Refflag, and determination signal Refwin, or to invalidate all the signals. In addition, the above-described embodiments may be combined.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device allowing testing to be performed, comprising:

a memory cell array including a plurality of memory cells arranged in a matrix;

an input terminal receiving a signal;

a complete hidden refresh circuit for performing a refresh operation without being externally commanded for data stored in said plurality of memory cells; and a refresh control circuit configured to receive the signal input through said input terminal and to forcibly terminate the function of the complete hidden refresh circuit independent of an operation of said memory cell array, wherein a function of said complete hidden refresh circuit is invalidated in response to the signal input through said input terminal.

2. The semiconductor memory device according to claim 1, wherein said complete hidden refresh circuit includes:

a refresh circuit for outputting a refresh command signal for commanding execution of said refresh operation; and a control circuit for executing said refresh operation in response to said refresh command signal, wherein a function of said refresh circuit is invalidated in response to a signal input from said input terminal.

3. A semiconductor memory device allowing testing to be performed, comprising:

a memory cell array including a plurality of memory cells arranged in a matrix;

an input terminal receiving a signal; and a complete hidden refresh circuit for performing a refresh operation without being externally commanded for data stored in said plurality of memory cells, wherein a function of said complete hidden refresh circuit is invalidated in response to the signal input through said input terminal, and said complete hidden refresh circuit includes, a refresh circuit for outputting a refresh command signal for commanding execution of said refresh operation, wherein a function of said refresh circuit is invalidated in response to a signal input from said input terminal, and a control circuit for executing said refresh operation in response to said refresh command signal, wherein said refresh circuit includes:
- a timer circuit for outputting a cycle signal at a time interval required to refresh the data stored in said plurality of memory cells,
- a command-signal activating circuit for activating said refresh command signal in response to said cycle signal, and
- a determination circuit for determining as to whether or not said refresh command signal activated needs to be output.

4. The semiconductor memory device according to claim 3, wherein a function of said timer circuit is invalidated in response to a signal input from said input terminal.

5. The semiconductor memory device according to claim 3, wherein a function of said command-signal activating circuit is invalidated in response to a signal input through said input terminal.

6. The semiconductor memory device according to claim 3, a function of said determination circuit is invalidated in response to a signal input through said input terminal.

* * * * *